United States Patent
Sun et al.

(10) Patent No.: US 9,882,558 B1
(45) Date of Patent: Jan. 30, 2018

(54) POWER-ON RESET CIRCUIT

(71) Applicant: Marvell International Ltd., Hamilton (BM)

(72) Inventors: Peng Sun, Singapore (SG); Xiao Yu Miao, Singapore (SG); Ah Siah Chua, Singapore (SG)

(73) Assignee: MARVELL INTERNATIONAL LTD., Hamilton (BM)

( * ) Notice: Subject to any disclaimer, the term of this patent is extended or adjusted under 35 U.S.C. 154(b) by 0 days.

(21) Appl. No.: 15/198,746

(22) Filed: Jun. 30, 2016

Related U.S. Application Data

(60) Provisional application No. 62/189,342, filed on Jul. 7, 2015.

(51) Int. Cl.
*H03K 17/22* (2006.01)

(52) U.S. Cl.
CPC ..... *H03K 17/223* (2013.01); *H03K 2017/226* (2013.01)

(58) Field of Classification Search
CPC . H03K 17/22; H03K 17/223; H03K 2017/226
USPC ................................................ 327/142, 143
See application file for complete search history.

(56) References Cited

U.S. PATENT DOCUMENTS

| 5,302,861 | A | * | 4/1994 | Jelinek | H03K 17/223 327/143 |
|---|---|---|---|---|---|
| 6,137,324 | A | | 10/2000 | Chung | |
| 6,683,481 | B1 | | 1/2004 | Zhou et al. | |
| 6,847,240 | B1 | | 1/2005 | Zhou | |
| 7,212,046 | B2 | * | 5/2007 | Hur | G05F 3/205 327/143 |
| 8,253,452 | B2 | * | 8/2012 | Kushnarenko | G05F 3/30 327/143 |
| 2009/0267682 | A1 | * | 10/2009 | Hehemann | H03K 17/223 327/530 |
| 2010/0156477 | A1 | * | 6/2010 | Chellappa | H03K 17/22 327/143 |

* cited by examiner

*Primary Examiner* — William Hernandez

(57) ABSTRACT

Power-on reset circuits and methods for providing a power-on reset signal are provided. A first branch is configured to receive the power supply voltage. The first branch comprises a first current generator configured to generate a first current having a positive relationship with a power supply voltage. A second branch receives the power supply voltage and comprises a second current generator that is configured to generate a second current. A relationship between the first and second currents indicates whether the power supply voltage exceeds a threshold voltage of the power-on reset circuit. A current comparator circuit compares the first current to the second current and generates an output based on the comparison. The power-on reset signal is asserted when the output indicates that the second current is greater than the first current.

16 Claims, 5 Drawing Sheets

POWER-ON RESET CIRCUIT

CROSS-REFERENCE TO RELATED APPLICATIONS

This application claims priority to U.S. Provisional Patent Application No. 62/189,342, filed Jul. 7, 2015, entitled "Power-on-Reset With Temperature Compensation and Hysteresis Feature," which is incorporated herein by reference in its entirety.

FIELD

The technology described herein relates generally to electrical circuits and more particularly to power-on reset (POR) circuits.

BACKGROUND

Power-on reset (POR) circuits are commonly used in electronic systems to ensure that a stable operating power-up condition has been achieved. In an integrated circuit, for instance, a POR circuit may be utilized to ensure that an adequate power supply voltage (e.g., VDD) is provided to the integrated circuit before the integrated circuit is operationally enabled. If the power supply voltage is inadequate and/or not within an acceptable range, the POR circuit causes the chip to be inoperable or operationally disabled. Once an adequate power supply voltage is received by the POR circuit, the POR circuit enables the operation of the chip via a signal. This signal is commonly referred to as a "power-on reset signal." The POR circuit may also generate a signal based on a determination that the power supply voltage has dropped below a predetermined value, with this signal being used to disable the chip.

The description above is presented as a general overview of related art in this field and should not be construed as an admission that any of the information it contains constitutes prior art against the present patent application.

SUMMARY

Examples of a power-on reset circuit and method for providing a power-on reset signal are provided. An example power-on reset circuit includes a first branch configured to receive a power supply voltage. The first branch comprises a first current generator configured to generate a first current having a positive relationship with the power supply voltage. A second branch is configured to receive the power supply voltage and comprises a second current generator that is configured to generate a second current. A relationship between the first and second currents indicates whether the power supply voltage exceeds a threshold voltage of the power-on reset circuit. A current comparator circuit is configured to compare the first current to the second current and generate an output based on the comparison. The power-on reset signal is asserted when the output indicates that the second current is greater than the first current.

Another example power-on reset circuit includes a first branch configured to receive a power supply voltage. The first branch comprises a first current generator configured to generate a first current. A second branch is configured to receive the power supply voltage and comprises a second current generator that is configured to generate a second current. A relationship between the first and second currents indicates whether the power supply voltage exceeds a threshold voltage of the power-on reset circuit. A current comparator circuit is configured to compare the first current to the second current and generate an output based on the comparison. The power-on reset signal is asserted when the output indicates that the second current is greater than the first current. A feedback network is configured to receive the output of the current comparator and draw a current from the power supply voltage, where an amount of the current drawn varies based on the output.

In an example method for providing a power-on reset signal, a first current having a positive relationship with a power supply voltage is generated using a first current generator. The first current is received at a voltage divider circuit having a first node connected to the first current generator and a second node connected to a ground reference voltage. A second current is generated using a second current generator. The second current generator is coupled to an intermediate node of the voltage divider circuit. The first current is compared to the second current, and an output is generated based on the comparison. The power-on reset signal is asserted when the output indicates that the second current is greater than the first current.

DETAILED DESCRIPTION

The present disclosure provides power-on reset (POR) circuits. Such circuits are utilized in electronic systems, for instance, to provide a power-on reset signal when a power supply voltage exceeds a threshold voltage. In accordance with techniques described the instant disclosure, a POR circuit includes a first current generator configured to generate a first current and a second current generator configured to generate a second current. In embodiments, a relationship between the first and second currents (e.g., a ratio between the first and second currents, a difference between the first and second currents, etc.) indicates whether the power supply voltage exceeds the threshold voltage. Further, as described below, the relationship between the first and second currents is based on one or more parameters of the POR circuit. Such parameters include, for instance, one or more resistance values of the POR circuit and/or one or more physical parameters of transistors utilized in the POR circuit, among others. These parameters are described in detail below. The POR circuit further includes a current comparator circuit that compares the first and second currents and generates an output based on the comparison.

In embodiments, the POR circuit asserts the power-on reset signal (e.g., drives the power-on reset signal low or high) when the output of the current comparator circuit indicates that the second current is greater than the first current. The POR circuit thus treats the comparison of the first and second currents as a proxy for the comparison of the power supply voltage to the threshold voltage. In other words, when the current comparator circuit generates the output indicating that the second current is greater than the first current, this indicates that the power supply voltage has exceeded the threshold voltage, and that therefore, the power-on reset signal should be asserted. The current comparison techniques of the instant disclosure provide advantages over conventional techniques that are based on voltage comparisons (e.g., comparing the power supply voltage or a voltage derived therefrom to a reference voltage, etc.). These advantages are described below. The techniques of the instant disclosure also provide a temperature-compensated threshold voltage and a hysteresis feature, as explained below.

Figure 1A:
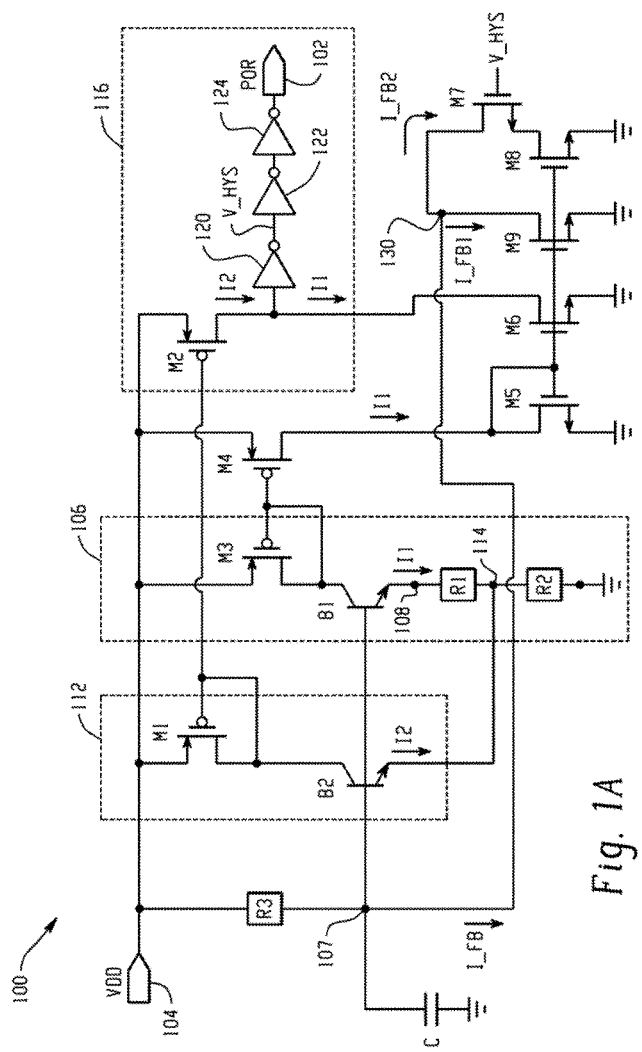
FIG. 1A depicts a power-on reset (POR) circuit, according to an embodiment.

FIG. 1A depicts a power-on reset (POR) circuit 100, according to an embodiment. In the example of FIG. 1A, the POR circuit 100 is configured to drive a power-on reset signal 102 low (e.g., the signal 102 is driven from a non-zero voltage to a voltage of zero) when a power supply voltage 104 (labeled "VDD" in the illustration of FIG. 1A) exceeds a first threshold voltage. When the power supply voltage level 104 exceeds the first threshold voltage and the power-on reset signal 102 is driven low, this indicates, in embodiments, that the power supply voltage level 104 has reached an acceptable operating voltage level for a circuit or device (e.g., a circuit or device coupled to the POR circuit 100, a circuit or device of which the POR circuit 100 is a part, etc.). This circuit or device (e.g., an integrated circuit, a programmable logic device) receives the power-on reset signal 102 and performs a power-up reset sequence (e.g., configuration data is loaded into memory of the device, I/O pins are enabled, circuit or device becomes ready to begin performing its programmed functions, etc.) based on the power-on reset signal 102 being driven low, in embodiments.

The POR circuit 100 is further configured to drive the power-on reset signal 102 high (e.g., the signal 102 is driven from a voltage of zero to a non-zero voltage) when the power supply voltage 104 has dropped below a second threshold voltage. When the power supply voltage level 104 has dropped below the first threshold voltage and the power-on reset signal 102 is driven high, this indicates, in embodiments, that the power supply voltage level 104 has reached or is nearing an unacceptably low level for the circuit or device. The circuit or device receives the power-on reset signal 102 and performs a power-down reset sequence (e.g., saving current state information, informing other integrated to stop sending data to the circuit or device, etc.) based on the power-on reset signal 102 being driven high, in embodiments. To illustrate the driving of the power-on reset signal 102 low and high based on the changing power supply voltage 104, reference is made to FIG. 1B. This figure is a graph depicting example voltage waveforms of the power supply voltage 104 and the power-on reset signal 102 over time.

Figure 1B:
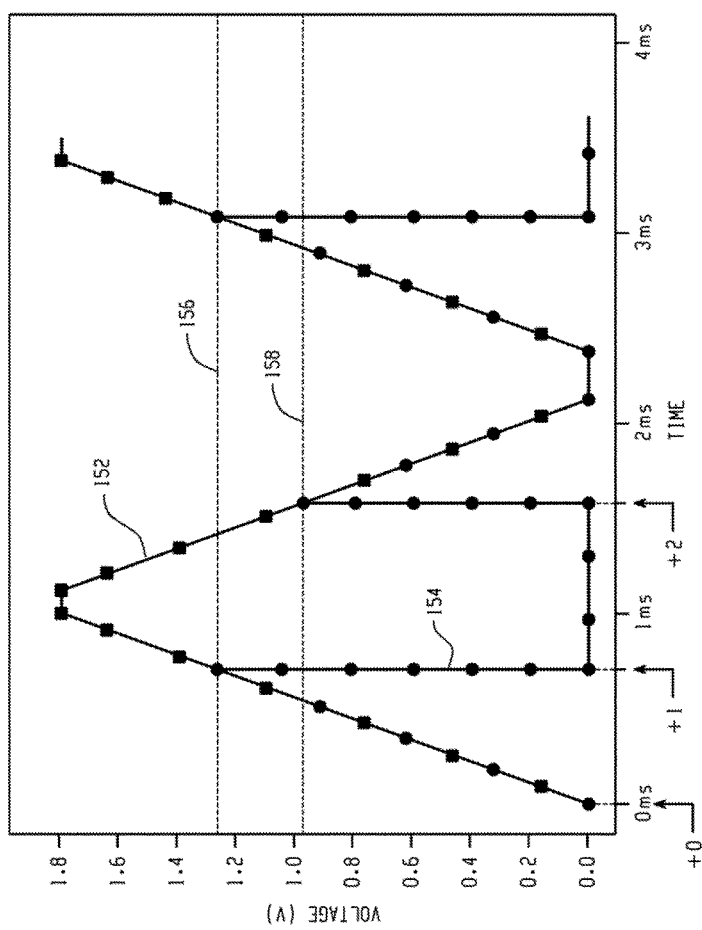
FIG. 1B is a graph depicting voltage levels of a power supply voltage signal and a power-on reset signal, according to an embodiment.

In FIG. 1B, waveform 152 represents a voltage level of the power supply voltage 104, and waveform 154 represents a voltage level of the power-on reset signal 102. The waveform 152 is represented in FIG. 1B by the curves marked with squares, and the waveform 154 is represented in FIG. 1B by the curves marked with circles. Curves marked by both squares and circles indicates that the waveforms 152 and 154 are overlapping each other or approximately overlapping each other. It is noted that the squares and circles are merely used to differentiate between the waveforms 152 and 154, and such squares and circles do not represent different sampling points of the waveforms 152 and 154. As shown in the figure, starting at a time t0, the power supply voltage level 152 begins to ramp up from zero volts, and the voltage level 154 of the power-on reset signal 102 tracks the power supply voltage level 152 during this ramp-up period. When the power supply voltage level 152 reaches a threshold voltage level 156 at a time t1, the voltage level 154 of the power-on reset signal 102 is driven low. When this transition from a non-zero voltage to zero volts occurs, the power-on reset signal 102 is said to be "asserted." In the example of FIG. 1A, the power supply voltage level 152 continues to increase and then ramps down. When the power supply voltage level 152 falls below a threshold voltage level 158 at a time t2, the voltage level 154 of the power-on reset signal 102 is driven high. It is noted that in the example of FIG. 1A, the threshold voltage levels 156, 158 are different. The difference in the threshold voltage levels 156, 158 is a result of a hysteresis feature of the POR circuit 100, as described in further detail below. It is noted that the voltage waveforms shown in FIG. 1B are merely examples, and that the voltage of the power-on reset signal exhibits different characteristics in other examples.

With reference again to FIG. 1A, the POR circuit 100 includes a first branch 106 that is coupled to the power supply voltage 104. As shown in the figure, the first branch 106 includes a metal-oxide-semiconductor field-effect transistor (MOSFET) M3 that is coupled to the power supply voltage 104. The MOSFET M3 is a p-type MOSFET including a source terminal connected to the power supply voltage 104 and a drain terminal that is connected to the MOSFET's gate terminal, in embodiments. As described in further detail below, the MOSFET M3 comprises a portion of a current mirror that couples the first branch 106 to a current comparator circuit 116, with the current mirror being configured to cause a current i1 in the first branch 106 to be mirrored (e.g., copied) to the current comparator circuit 116. As described below, the current comparator circuit 116 is operative to compare a current level of the current I1 to a current level of a current I2 in a second branch 112 of the circuit 100.

The first branch 106 further includes a bipolar junction transistor (BJT) B1 coupled to the MOSFET M3. Specifically, in the example of FIG. 1A, the BJT B1 is an NPN BJT with a collector terminal coupled to the drain terminal of the MOSFET M3, an emitter terminal connected to a node 108, and a base terminal connected to a node 107. Under the techniques of the instant disclosure, the BJT B1 operates as a first current generator that is configured to generate the first current I1 shown in the figure. The first current I1 has a positive relationship with the power supply voltage 104 under most operating conditions, such that the first current I1 increases as the power supply voltage 104 increases. In some embodiments, the first current I1 and the power supply voltage 104 have a positive, linear relationship, such that as the power supply voltage 104 increases, the first current I1 increases linearly. It is noted that the relationship between the first current I1 and the power supply voltage 104 is not linear in some embodiments. Also included in the first branch 106 is a voltage divider circuit comprising resistors R1 and R2. The resistor R1 is coupled between the emitter terminal of the BJT B1 and an intermediate node 114 of the voltage divider circuit, and the resistor R2 is coupled between the intermediate node 114 and a ground reference voltage.

The example POR circuit 100 of FIG. 1A further includes a second branch 112 that is coupled to the power supply voltage 104. As shown in the figure, the second branch 112 includes a MOSFET M1 that is coupled to the power supply voltage 104. The MOSFET ML is a p-type MOSFET including a source terminal connected to the power supply voltage 104 and a drain terminal that is connected to the MOSFET's gate terminal. As described in further detail below, the MOSFET M1 comprises a portion of a current mirror that couples the second branch 112 to the current comparator circuit 116, with the current mirror being configured to cause a current I2 in the second branch 112 to be copied to the current comparator circuit 116.

The second branch 112 further includes a BJT B2 coupled to the MOSFET M1. Specifically, in the example of FIG. 1A, the BJT B2 is an NPN BJT with a collector terminal coupled to the drain terminal of the MOSFET M1, an emitter terminal connected to the node 114, and a base terminal connected to the node 107. The BJT B2 thus is coupled to the voltage divider circuit of the first branch 106, with the emitter terminal of the BJT B2 being connected to the intermediate node 114 of the voltage divider. Under the techniques of the instant disclosure, the BJT B2 operates as a second current generator that is configured to generate the second current I2 shown in the figure.

The POR circuit 100 utilizes current mirrors to couple the currents I1 and I2 of the respective first and second branches 106, 112 to the current comparator circuit 116. Specifically, first and second current mirrors couple the first branch 106 to the current comparator circuit 116 and cause the current I1 in the first branch 106 to be copied to the current comparator circuit 116. In FIG. 1A, the first current mirror includes the above-described MOSFET M3 and a MOSFET M4 that is coupled to the power supply voltage 104. As shown in the figure, the gate terminal of the MOSFET M3 is connected to the gate terminal of the MOSFET M4. Further, the drain terminal of the MOSFET M3 is connected to the gate terminals of the MOSFETs M3, M4. Based on such connections, the aforementioned first current mirror is formed, with the first current mirror causing the current I1 in the first branch 106 to be mirrored, or copied, to the branch of the POR circuit 100 including the MOSFET M4. The second current mirror used in copying the current I1 to the current comparator circuit 116 includes MOSFETs M5 and M6. The connections between the MOSFETs M5 and M6 (similar to the above-described connections between the MOSFETs M3 and M4) implement the second current mirror that causes the current I1 to be copied to the current comparator circuit 116.

A third current mirror couples the second branch 112 to the current comparator circuit 116 and causes the current I2 in the second branch 112 to be copied to the current comparator circuit 116. In FIG. 1A, the third current mirror includes the above-described MOSFET M1 and a MOSFET M2 that is coupled to the power supply voltage 104. As shown in the figure, the gate terminal of the MOSFET M1 is connected to the gate terminal of the MOSFET M2. Further, as noted above, the drain terminal of the MOSFET M1 is connected to the gate terminals of the MOSFETs M1, M2. Based on such connections, the third current mirror is formed, with the third current mirror causing the current I2 in the second branch 112 to be copied to the current comparator circuit 116.

The current comparator circuit 116 is configured to (i) compare the first current I1 flowing in the first branch 106 to the second current I2 flowing in the second branch 112, and (ii) generate an output V_HYS based on the comparison. The output V_HYS indicates whether the first current I1 exceeds the second current I2, and vice versa. To implement the current comparator circuit 116, the POR circuit 100 includes an inverter 120. The inverter 120 generates the output V_HYS that is low (e.g., equal to zero volts or substantially equal to zero volts) when the second current I2 is greater than the first current I1, in embodiments. When the second current I2 is less than the first current I1, the inverter 120 generates the output V_HYS that is high (e.g., not equal to zero volts), in embodiments. As explained in greater detail below, the output V_HYS of the inverter 120 changing from high to low indicates that the second current I2 has begun to exceed the first current I1 and further that the power supply voltage 104 has begun to exceed a threshold voltage of the circuit 100.

Under most operating conditions, the first current I1 in the first branch 106 has a positive relationship with the power supply voltage 104, such that the first current I1 increases with increasing power supply voltage 104. With the first and second branches 106, 112 connected in the manner illustrated in FIG. 1A, the first current I1 in the first branch 106 is larger than the second current I2 in the second branch 112 while the power supply voltage 104 is less than the threshold voltage. Thus, with reference again to FIG. 1B, the first current I1 is larger than the second current I2 during the time period between t0 and t1. When the first current I1 in the first branch 106 is larger than the second current I2 in the second branch 112, the output V_HYS of the inverter 120 is high, as noted above. When the power supply voltage 104 exceeds the threshold voltage, the second current I2 in the second branch 112 is larger than the first current I1 in the first branch 106. Thus, with reference to FIG. 1B, the second current I2 is larger than the first current I1 during the time period between t1 and t2. Under these conditions, the output V_HYS of the inverter 120 is low, as noted above.

As seen in FIG. 1A, the output V_HYS is received at a second inverter 122, and an output of the second inverter 122 is received at a third inverter 124. An output of the third inverter 124 is the power-on reset signal 102, in examples. The arrangement of inverters 120, 122, 124 causes the power-on reset signal 102 to have a same voltage level as the V_HYS signal, with changes in the V_HYS signal (e.g., transitions from a voltage of zero to a non-zero voltage, and vice versa) being seen in the power-on reset signal 102 after a delay caused by the inverters 122, 124. In examples, an electronic system to which the POR circuit 100 is coupled interprets the power-on reset signal 102 as being asserted when the signal 102 transitions from a non-zero voltage level to a zero voltage level, and/or when the signal 102 transitions from a zero voltage level to a non-zero voltage level. Thus, with reference to FIG. 1B, the transitions of the voltage level 154 of the power-on reset signal 102 occurring at the times t1 and t2 are examples of the power-on reset signal 102 being asserted. The transition at the time t1 occurs when the second current I2 begins to exceed the first current I1 (e.g., when the power supply voltage 104 begins to exceed the threshold voltage), and the transition at the time t2 occurs when the second current I2 falls below the first current I1 (e.g., when the power supply voltage 104 falls below the threshold voltage), as described above.

As is evident from the description above, the POR circuit 100 treats the comparison of the first and second currents I1, I2 as a proxy for the comparison of the power supply voltage 104 to the threshold voltage. In other words, the POR circuit 100 drives the power-on reset signal 102 low when the output of the current comparator circuit 116 indicates that the second current I2 has begun to exceed the first current I1 because this relationship of the currents I1, I2 indicates that the power supply voltage 104 is now exceeding the threshold voltage (e.g., as shown at time t1 of FIG. 1B). Conversely, the power-on reset signal 102 is driven high when the output of the current comparator circuit 116 indicates that the second current I2 has fallen below the first current I1 because this relationship between the currents I1, I2 indicates that the power supply voltage 104 has fallen below the threshold voltage (e.g., as shown at time t2 of FIG. 1B).

The POR circuit 100 of FIG. 1A includes a hysteresis feature. As described above with reference again to FIG. 1B, when the power supply voltage 104 reaches the threshold voltage level 156, the power-on reset signal 102 is driven low, and when the power supply voltage 104 falls below the threshold voltage level 158, the power-on reset signal 102 is driven high. The difference between the threshold voltage levels 156, 158 is a result of a hysteresis feature of the POR circuit 100. With reference again to FIG. 1A, to implement the hysteresis feature, the circuit 100 includes an n-type MOSFET M7 that receives the V_HYS signal at its gate terminal. In the example of FIG. 1A, the MOSFET M7 is coupled to another n-type MOSFET M8 in the manner shown in the figure.

Further, to implement the hysteresis feature, the circuit 100 includes an n-type MOSFET M9 that is coupled to the MOSFET M7. A node 130 to which the MOSFETs M7 and M9 are coupled is connected to the node 107 in the manner shown in the figure. The node 107 is coupled to the power supply voltage 104 via a resistor R3, and a capacitor C is coupled between the node 107 and the ground reference voltage. The capacitor C is used to extend reset time and guarantee a robust feedback loop. Like all multistage negative feedback circuits, the POR circuits of the instant disclosure need frequency compensation to keep the system stable. Otherwise, system might get oscillated. The capacitor C is used to set the dominant pole of the feedback loop and make second pole far away from gain-bandwidth. When the power supply voltage 104 ramps up too fast, the capacitor C also helps to hold the base voltage of the BJTs B1 and B2 and keeps the reset signal long enough.

The MOSFETs M7, M8, and M9 may be considered to be a "feedback network." The feedback network including these MOSFETs is configured to receive the V_HYS signal generated by the current comparator circuit 116 and (i) draw a first feedback current from the power supply voltage 104 when the V_HYS signal indicates that the first current I1 is greater than the second current I2, and (ii) draw a second feedback current from the power supply voltage 104 when the V_HYS signal indicates that second current I2 is greater than the first current I1. Specifically, when I1>I2, the V_HYS signal is high (e.g., has a non-zero voltage), as described above. When the V_HYS signal is high, the MOSFET M7 is "turned on," and current flows in the branch comprising the MOSFETs M7 and M8. In embodiments, the MOSFET M7 functions as a switch, with the switch being opened and closed based on whether the V_HYS signal is high or low. In the example of FIG. 1A, feedback current I_FB drawn from the power supply voltage 104 is illustrated as being sourced from the node 107. The feedback current I_FB is received at the node 130. According to basic circuit theory, I_FB=I_FB1+I_FB2, where the current I_FB1 is the current through the branch including the MOSFET M9, and the current I_FB2 is the current through the branch including the MOSFETs M7 and M8. Thus, when the V_HYS signal is high (e.g., not equal to zero volts), the MOSFET M7 is turned on, as noted above, and I_FB2 is not equal to zero (i.e., current is flowing in the branch).

Conversely, when I2>I1, the V_HYS signal is low (e.g., has a voltage of zero), as described above. When the V_HYS signal is low, the MOSFET M7 is "turned off," and current does not flow in the branch comprising the MOSFETs M7 and M8. Under these circumstances, the current I_FB2 is equal to zero. Thus, (i) when the V_HYS signal is high, I_FB=I_FB1+I_FB2, where I_FB2≠0, and (ii) when the V_HYS signal is low, I_FB=I_FB1+0, with I_FB2 being equal to zero. The feedback current I_FB drawn by the feedback circuit is larger when the V_HYS signal is high, as compared to when the V_HYS signal is low.

In embodiments, the power supply voltage 104 of the POR circuit 100 is equal to a sum of a base-emitter voltage of BJT B1, and voltages across resistors R1, R2, and R3, as follows:

$$VDD = Vbe1 + I\_FB \cdot R3 + I1 \cdot R1 + (I1+I2) \cdot R2 \quad \text{(Equation 1)}$$

where Vbe1 is base-emitter voltage of B1, I_FB is the feedback current equal to the sum of I_FB1 and I_FB2, as described above, and R1, R2, and R3 are the resistance values of the circuit 100 described above. In the POR circuit 100, the power supply voltage 104 is denoted as sum of voltage across R3, base-emitter voltage of B2, and voltage across R2, in examples:

$$VDD = Vbe2 + I\_FB \cdot R3 + (I1+I2) \cdot R2 \quad \text{(Equation 2)}$$

where Vbe2 is base-emitter voltage of B2. Equations 1 and 2 show that a relationship between the first current I1 and the second current I2 is as follows:

$$\frac{I2}{I1} = \frac{1}{M} e^{\frac{I1 \cdot R1}{V_T}} \quad \text{(Equation 3)}$$

where $V_T$ is the thermal voltage, which is equal to approximately 26 mV at a temperature of 300 K (e.g., room temperature), and M is the emitter area ratio between the BJTs B1 and B2. From Equations 1 and 3, it can be seen that I2 has a positive relationship with power supply voltage. When the second current I2 rises with power supply voltage and becomes larger than $V_T/R1$ lnM, the second current I2 is greater than the first current I1. Meanwhile, the power-on reset signal 102 is low (e.g., the power-on reset signal 102 has a voltage of zero volts).

In embodiments, the threshold voltage of the POR circuit 100 is as follows:

$$V_{threshold} = Vbe2 + (KR3/R1 + 2R2/R1) V_T \ln M \quad \text{(Equation 4)}$$

where K is the ratio of I_FB and I1. From Equation 4 above, it can be seen that when the V_HYS signal is high and I_FB=I_FB1+I_FB2 (I_FB2≠0), the threshold voltage has a first value $V_{threshold\_1}$, and when the V_HYS signal is low and I_FB=I_FB1+0 (I_FB2=0), the threshold voltage has a second value $V_{threshold\_2}$, where $V_{threshold\_1} > V_{threshold\_2}$. Further, in Equation 4, the first part Vbe2 is negatively related with temperature and second part $V_T$ is positively related with temperature. It can be seen that the threshold voltage of the POR circuit 100 is temperature compensated by choosing proper resistor ratio and bipolar ratio.

In an embodiment, the power-on reset signal 102 has a same voltage level as the V_HYS signal, as noted above. Accordingly, when the power-on reset signal 102 is high, the threshold voltage has the first value $V_{threshold\_1}$, and when the power-on reset signal 102 is low, the threshold voltage has the second value $V_{threshold\_2}$, where $V_{threshold\_1} > V_{threshold\_2}$. This is illustrated in FIG. 1B, which shows that during the time period t0-t1 when the voltage level 154 of the power-on reset signal 102 is high (e.g., a non-zero voltage), the POR circuit 100 has the threshold voltage level 156, and during the time period t1-t2 when the voltage level 154 of the power-on reset signal 102 is low (e.g., zero volts), the POR circuit 100 has the threshold voltage level 158, where threshold voltage level 156>threshold voltage level 158. The use of the two different threshold voltage levels 156, 158 provides a hysteresis feature, such that after the power-on reset signal 102 is asserted at the time t1 in response to the power supply voltage 104 exceeding the first threshold $V_{threshold\_1}$, the POR circuit 100 will not reassert the power-on reset signal 102 until the power supply voltage 104 has fallen below the second threshold $V_{threshold\_2}$, where $V_{threshold\_1} > V_{threshold\_2}$. This hysteresis feature permits a relatively high turn-on threshold voltage $V_{threshold\_1}$ a to be utilized without a concern that the power-on reset signal 102 will be reasserted based on normal fluctuations in the power supply voltage 104.

Conventional power-on reset circuits utilize a bandgap reference voltage generator for generating a reference voltage. In the conventional systems, a voltage comparator (e.g., an analog voltage comparator) is used to compare the power supply voltage to the reference voltage, and a power-on reset signal is generated based on the comparison. The conventional systems are deficient in several respects. For example, the bandgap reference voltage generator is typically a complex circuit including a start-up circuit and an amplifier circuit, among other portions. The complexity of such bandgap reference voltage generators causes them to consume significant space and/or power. Further, the bandgap reference voltage generator circuit is typically a slow, closed-loop circuit that requires a long settling time depending on a power consumption of the circuit. Due to the slowness and the long settling time of the bandgap reference voltage generator, if the power supply voltage (e.g., VDD) rises too fast, the conventional power-on reset circuit may be unable to output the reset signal.

In contrast to the conventional techniques, the power-on reset circuits of the instant disclosure do not utilize a closed-loop bandgap reference voltage generator circuit. Thus, the power-on reset circuits of the instant disclosure are simpler, require less area, and consume less power than the conventional techniques. Further, because a slow, closed-loop bandgap reference voltage generator circuit is not utilized in embodiments disclosed herein, the power-on reset circuits of the instant disclosure can respond to power supply voltages that rise and/or fall quickly and generate power-on reset signals accordingly. The power-on reset circuits of the instant application utilize current comparisons (e.g., comparing a current level of the first current I1 to a current level of the second current I2) in order to generate the power-on reset signal, and the use of such current comparisons differ from conventional systems that generate power-on reset signals based on voltage comparisons. In such conventional systems, one of the voltages being compared typically is a bandgap reference voltage generated by a slow, closed-loop bandgap reference voltage generator circuit (e.g., the bandgap reference voltage is compared to the power supply voltage using a voltage comparator). The techniques of the instant disclosure use current comparisons to determine whether the power supply voltage has exceeded the threshold voltage of the POR circuit, thus avoiding the need for a slow, closed-loop bandgap reference voltage generator circuit.

It is noted that the POR circuit 100 of FIG. 1A is not limited to the particular set of components shown in the figure. For example, although the figure depicts particular transistor types (e.g., NPN BJTs, p- and n-type MOSFETs, etc.), the POR circuit 100 is not limited to these transistor types. Further, for instance, the specific circuit connections for implementing the above-described current mirrors vary in different embodiments and are not limited to those shown in the figure.

Figure 2:
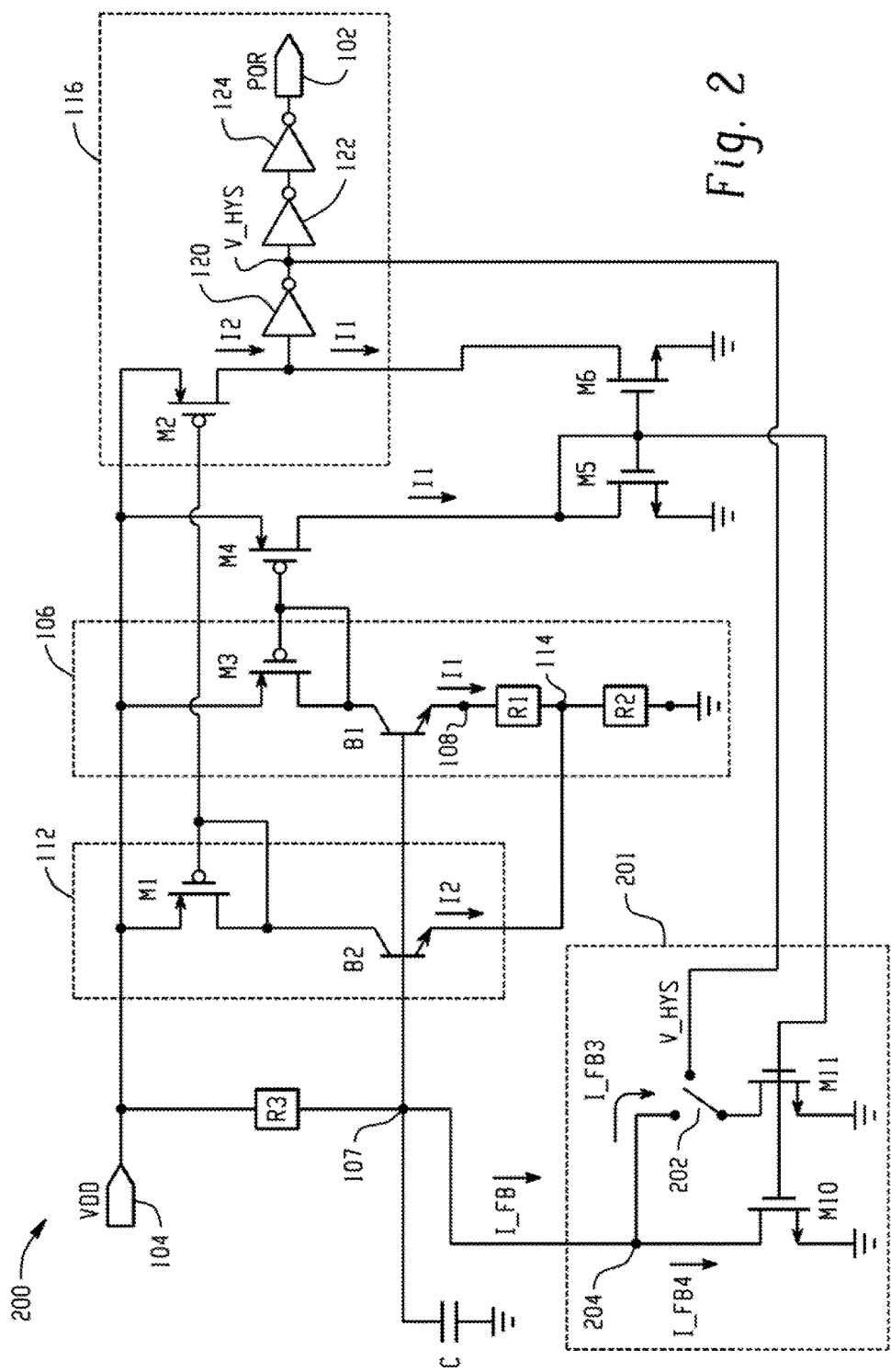
FIG. 2 depicts another POR circuit, according to an embodiment.

FIG. 2 depicts a POR circuit 200, according to another embodiment. The POR circuit 200 of FIG. 2 includes components that are the same as or similar to those of FIG. 1A, and like reference numerals are used to designate like parts in these figures. Further, for brevity, the descriptions of features described above with reference to FIG. 1A are not repeated here. In FIG. 2, a feedback network 201 used to implement a hysteresis feature differs from the feedback network of FIG. 1A described above. The feedback network 201 is configured to receive the V_HYS signal generated by the current comparator circuit 116 and (i) draw a first feedback current from the power supply voltage 104 when the V_HYS signal indicates that the first current I1 is greater than the second current I2, and (ii) draw a second feedback current from the power supply voltage 104 when the V_HYS signal indicates that second current I2 is greater than the first current I1. As described in further detail below, by drawing the different first and second feedback currents, the feedback network 201 causes the threshold voltage of the POR circuit 200 to change, thus resulting in the hysteresis feature.

In FIG. 2, the feedback network 201 includes a switch 202 that receives the V_HYS signal. The switch 202 is configured to open and close based on a voltage level of the V_HYS signal, as described below. The switch 202 is coupled to an n-type MOSFET M11 in the manner shown in the figure. The feedback network 201 further includes an n-type MOSFET M10 that is coupled to the switch 202 at the node 107. As described above with reference to FIG. 1A, the node 107 is coupled to the power supply voltage 104 via the resistor R3, and the capacitor C is coupled between the node 107 and the ground reference voltage.

The feedback network 201 is configured to receive the V_HYS signal generated by the current comparator circuit 116 and (i) draw a first feedback current from the power supply voltage 104 when the V_HYS signal indicates that the first current I1 is greater than the second current I2, and (ii) draw a second feedback current from the power supply voltage 104 when the V_HYS signal indicates that second current I2 is greater than the first current I1. Specifically, when I1>I2, the V_HYS signal is high (e.g., has a non-zero voltage), as described above. In embodiments, when the V_HYS signal is high, the switch 202 is closed, such that the drain of the MOSFET M11 is connected to the node 204, and current can flow in the branch comprising the MOSFET M11. In embodiments, the switch 202 is implemented via a MOSFET, and the V_HYS signal received at a gate of the MOSFET determines whether the switch 202 is opened or closed. The feedback current I_FB is received at a node 204. According to Kirchoff's Current Laws, I_FB=I_FB3+I_FB4, where the current I_FB3 is the current through the branch including the MOSFET M11, and the current I_FB4 is the current through the branch including the MOSFET M10. Thus, when the V_HYS signal is high, the switch 202 is closed, and I_FB3 is not equal to zero (i.e., current is flowing in the branch).

Conversely, when I2>I1, the V_HYS signal is low (e.g., has a voltage of zero), as described above. When the V_HYS signal is low, the switch 202 is open and current does not flow in the branch comprising the MOSFET M11. Under these circumstances, the current I_FB3 is equal to zero. Thus, (i) when the V_HYS signal is high, I_FB=I_FB3+I_FB4, where I_FB3≠0, and (ii) when the V_HYS signal is low, I_FB=0+I_FB4, with I_FB3 being equal to zero. The feedback current I_FB drawn by the feedback network 201 is larger when the V_HYS signal is high, as compared to when the V_HYS signal is low. As described above, a larger feedback current I_FB causes the POR circuit to have a higher threshold voltage, thus enabling a hysteresis feature.

FIGS. 1A and 2 illustrate specific embodiments of the instant disclosure. It is noted, however, that the instant disclosure is not limited to these particular embodiments. To illustrate another embodiment of the instant disclosure, reference is made to FIG. 3. This figure depicts a power-on reset (POR) circuit 300, according to an embodiment. The POR circuit 300 includes a first branch 312 that is configured to receive a power supply voltage VDD. The first branch 312 includes a first current generator 302 configured to generate a first current I1. The first current I1 has a positive relationship with the power supply voltage VDD under most operating conditions, such that the first current I1 increases as the power supply voltage VDD increases. In some embodiments, the first current I1 and the power supply voltage VDD have a positive, linear relationship, such that as the power supply voltage VDD increases, the first current I1 increases linearly. It is noted that the relationship between the first current I1 and the power supply voltage VDD is not linear in some embodiments. In examples, the first current generator 302 comprises a transistor (e.g., a BJT, MOSFET, etc.) that is configured to generate the first current I1. The first branch 312 further includes a resistance circuit 308 coupled between the first current generator 302 and a ground reference voltage. In examples, the resistance circuit comprises a voltage divider circuit including multiple resistors. An example of the resistance circuit 308 is the voltage divider described above with reference to FIGS. 1A and 2, which includes the resistors R1 and R2.

The POR circuit 300 also includes a second branch 314 that is configured to receive the power supply voltage VDD. The second branch 314 includes a second current generator 304 that is coupled to the resistance circuit 308 and configured to generate a second current I2. A relationship between the first current I1 and the second current I2 indicates whether the power supply voltage VDD exceeds a threshold voltage of the power-on reset circuit. The first and second current generators 304, 306 are coupled to different nodes of the resistance circuit 308, which causes the first current I1 and the second current I2 to be different from each other. In embodiments, each of the first and second current generators 302, 304 comprises a BJT, and a relationship between the first current I1 and the second current I2 is also based on the emitter area ratio between the BJTs making up the respective current generators 302, 304.

A current comparator circuit 306 is configured to compare a current level of the first current I1 to a current level of the second current I2 and generate an output V_HYS based on the comparison. The example current comparator circuit 306 of FIG. 3 includes an inverter 316 that is configured to perform the current comparison and generate the output V_HYS. When the first current I1 is larger than the second current I2, this causes the output V_HYS of the inverter 316 to be high. Conversely, when the second current I2 is larger than the first current I1, this causes the output V_HYS of the inverter 316 to be low. In embodiments, the POR circuit 300 asserts a power-on reset signal (e.g., drives a power-on reset signal from a high voltage to a low voltage, or vice versa) when the output V_HYS indicates that the second current I2 is greater than the first current I1.

Figure 3:
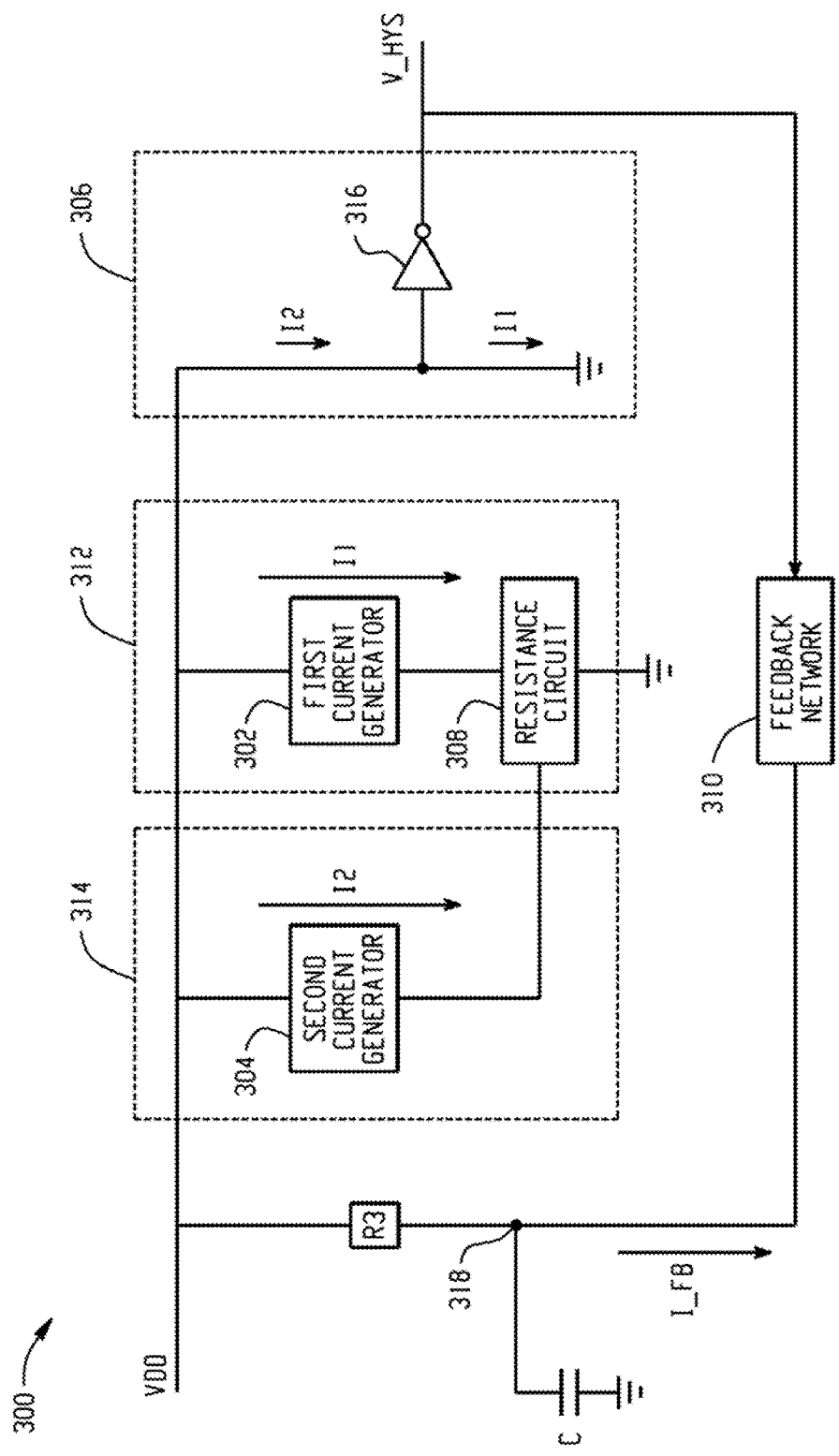
FIG. 3 is a block diagram illustrating features of a power-on reset circuit, according to an embodiment.

The POR circuit 300 of FIG. 3 further includes a feedback network 310 that is configured to receive the output V_HYS of the current comparator circuit 306. The feedback network 310 draws a current I_FB from the power supply voltage VDD, with an amount of the current drawn varying based on a voltage level of V_HYS. In embodiments, for instance, when the V_HYS output is high, the feedback network 310 draws a first feedback current, and when the V_HYS output is low, the feedback network 310 draws a second feedback current that is less than the first feedback current. By drawing two different feedback currents based on a voltage level of the output V_HYS of the current comparator circuit 306, the POR circuit 300 provides a hysteresis feature, as described above. The POR circuit 300 further includes a capacitor C coupled between a node 318 and the ground reference voltage.

Figure 4:
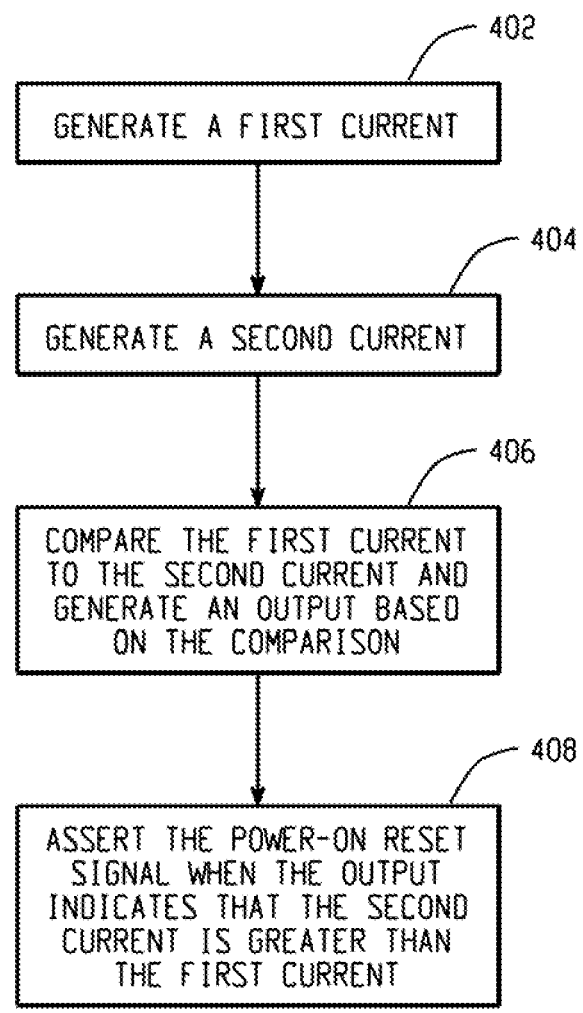
FIG. 4 is a flowchart depicting steps of an example method for providing a power-on reset signal, according to an embodiment.

FIG. 4 is a flowchart depicting steps of an example method for providing a power-on reset signal, according to an embodiment. FIG. 4 is described with reference to FIG. 1A above for ease of understanding. But the process of FIG. 4 is applicable to other hardware arrangements as well. At 402, a first current (e.g., current I1) having a positive relationship with the power supply voltage (e.g., power supply voltage 104) is generated using a first current generator (e.g., BJT B1). The first current is received at a voltage divider circuit (e.g., a voltage divider comprising resistors R1 and R2) having a first node (e.g., node 108) connected to the first current generator and a second node connected to a ground reference voltage (e.g., node of resistor R2 connected to the ground reference voltage). At 404, a second current (e.g., current I2) is generated using a second current generator (e.g., BJT B2). The second current generator is coupled to an intermediate node (e.g., node 114) of the voltage divider circuit. At 406, the first current is compared to the second current (e.g., by current comparator circuit 116), and an output (e.g., output V_HYS) is generated based on the comparison. At 408, a power-on reset signal (e.g., a power-on reset signal 102) is asserted when the output indicates that the second current is greater than the first current. It is noted that in embodiments, some of the steps 402-408 of FIG. 4 are performed simultaneously and not necessarily sequentially, and that in embodiments, the ordering of the steps 402-408 varies from that depicted in the figure.

This application uses examples to illustrate the invention. The patentable scope of the invention may include other examples.

What is claimed is:
1. A power-on reset circuit for providing a power-on reset signal when a power supply voltage reaches a threshold voltage, the power-on reset circuit comprising:
   a first branch configured to receive the power supply voltage, the first branch comprising a first current generator configured to generate a first current having a positive relationship with the power supply voltage, the first branch further comprising a voltage divider circuit having a first node connected to the first current generator and a second node connected to a ground reference voltage;
   a second branch configured to receive the power supply voltage, the second branch comprising a second current generator coupled to an intermediate node of the voltage divider circuit and configured to generate a second current, a relationship between the first and second currents indicating whether the power supply voltage exceeds the threshold voltage; and
   a current comparator circuit configured to
       compare the first current to the second current, and
       generate an output signal based on the comparison, the power-on reset signal being asserted when the output signal indicates that the second current is greater than the first current.

2. The power-on reset circuit of claim 1, further comprising:
a feedback network coupled to the power supply voltage and configured to (i) receive the output signal, and (ii) draw a first feedback current from the power supply voltage when the output indicates that the first current is greater than the second current, and (iii) draw a second feedback current from the power supply voltage when the output indicates that the second current is greater than the first current.

3. The power-on reset circuit of claim 2, wherein the first feedback current is greater than the second feedback current, wherein the threshold voltage has (i) a first value when the feedback network draws the first feedback current, and (ii) a second value when the feedback network draws the second feedback circuit, the first value being greater than the second value.

4. The power-on reset circuit of claim 1,
wherein the voltage divider circuit comprises (i) a first resistor coupled between the first node and the intermediate node, and (ii) a second resistor coupled between the intermediate node and the ground reference voltage.

5. The power-on reset circuit of claim 1, wherein the current comparator circuit comprises a third branch, the power-on reset circuit further comprising:
a first current mirror that couples the first branch to the third branch, the first current mirror being configured to cause the first current in the first branch to be copied to the third branch; and
a second current mirror that couples the second branch to the third branch, the second current mirror being configured to cause the second current in the second branch to be copied to the third branch.

6. The power-on reset circuit of claim 1, wherein the current comparator circuit comprises an inverter, the inverter being configured to generate (i) the output that is low when the second current is greater than the first current, and (ii) the output that is high when the first current is greater than the second current.

7. A power-on reset circuit for providing a power-on reset signal when a power supply voltage reaches a threshold voltage, the power-on reset circuit comprising:
a first branch configured to receive the power supply voltage, the first branch comprising a first current generator configured to generate a first current having a positive relationship with the power supply voltage;
a second branch configured to receive the power supply voltage, the second branch comprising a second current generator configured to generate a second current, a relationship between the first and second currents indicating whether the power supply voltage exceeds the threshold voltage;
a current comparator circuit configured to
compare the first current to the second current, and generate an output signal based on the comparison, the power-on reset signal being asserted when the output signal indicates that the second current is greater than the first current;
a resistor having first and second nodes, the first node being connected to the power supply voltage;
a capacitor coupled between the second node of the resistor and a ground reference voltage; and
a feedback network coupled to the second node of the resistor, the feedback network being configured to receive the output of the current comparator circuit and to draw a first feedback current from the power supply voltage when the output indicates that the first current is greater than the second current and to draw a second feedback current from the power supply voltage when the output indicates that the second current is greater than the first current.

8. The power-on reset circuit of claim 7, wherein the feedback network comprises:
a switch that receives the output of the current comparator circuit, wherein (i) when the output received at the switch indicates that the first current is greater than the second current, the switch is closed and current flows through the switch, and (ii) when the output received at the switch indicates that the second current is greater than the first current, the switch is open and current does not flow through the switch.

9. The power-on reset circuit of claim 8, wherein the feedback network comprises:
a metal-oxide-semiconductor field-effect transistor (MOSFET) including a gate terminal that receives the output of the current comparator circuit, the MOSFET being configured to operate as a switch such that (i) when the output received at the gate terminal indicates that the first current is greater than the second current, the MOSFET is turned on and current flows between drain and source terminals of the MOSFET, and (ii) when the output received at the gate terminal indicates that the second current is greater than the first current, the MOSFET is turned off and no current flows between the drain and source terminals.

10. The power-on reset circuit of claim 7,
wherein the first current generator comprises a first bipolar junction transistor (BJT) having a base terminal coupled to the second node of the resistor; and
wherein the second current generator comprises a second BJT having a base terminal coupled to the second node of the resistor.

11. A power-on reset circuit for providing a power-on reset signal when a power supply voltage reaches a threshold voltage, the power-on reset circuit comprising:
a first branch configured to receive the power supply voltage, the first branch comprising a first current generator configured to generate a first current, the first branch including a resistance circuit coupled between the first current generator and a ground reference voltage, wherein the resistance circuit comprises,
a voltage divider having a first node connected to the first current generator and a second node connected to the ground reference voltage, the voltage divider comprising (i) a first resistor coupled between the first node and an intermediate node, and (ii) a second resistor coupled between the intermediate node and the ground reference voltage;
a second branch configured to receive the power supply voltage, the second branch comprising a second current generator coupled to the intermediate node of the voltage divider and configured to generate a second current, a relationship between the first and second currents indicating whether the power supply voltage exceeds the threshold voltage;
a current comparator circuit configured to
compare the first current to the second current, and generate an output based on the comparison, the power-on reset signal being asserted when the output indicates that the second current is greater than the first current; and a feedback network configured to receive the output of the current comparator and draw a current from the power supply voltage, an amount of the current drawn varying based on the output.

12. The power-on reset circuit of claim 11,
wherein the feedback network is configured to (i) draw a first feedback current from the power supply voltage when the output indicates that the first current is greater than the second current, and (ii) draw a second feedback current from the power supply voltage when the output indicates that the second current is greater than the first current; and
wherein the threshold voltage varies based on the amount of current drawn by the feedback network.

13. The power-on reset circuit of claim 12, wherein the first feedback current is greater than the second feedback current, and wherein the threshold voltage has (i) a first value when the feedback network draws the first feedback current, and (ii) a second value when the feedback network draws the second feedback circuit, the first value being greater than the second value.

14. A power-on reset circuit for providing a power-on reset signal when a power supply voltage reaches a threshold voltage, the power-on reset circuit comprising:
a first branch configured to receive the power supply voltage, the first branch comprising a first current generator configured to generate a first current;
a second branch configured to receive the power supply voltage, the second branch comprising a second current generator configured to generate a second current, a relationship between the first and second currents indicating whether the power supply voltage exceeds the threshold voltage;
a current comparator circuit configured to
compare the first current to the second current, and generate an output based on the comparison, the power-on reset signal being asserted when the output indicates that the second current is greater than the first current;
a feedback network configured to receive the output of the current comparator and draw a current from the power supply voltage, an amount of the current drawn varying based on the output;
a resistor having first and second nodes, the first node being connected to the power supply voltage; and
a capacitor coupled between the second node of the resistor and a ground reference voltage, wherein the feedback network is coupled to the second node of the resistor and is configured to (i) draw a first feedback current from the power supply voltage when the output indicates that the first current is greater than the second current, and (ii) draw a second feedback current from the power supply voltage when the output indicates that the second current is greater than the first current.

15. The power-on reset circuit of claim 14, wherein the feedback network comprises:
a switch that receives the output of the current comparator circuit, wherein (i) when the output received at the switch indicates that the first current is greater than the second current, the switch is closed and current flows through the switch, and (ii) when the output received at the switch indicates that the second current is greater than the first current, the switch is open and current does not flow through the switch.

16. The power-on reset circuit of claim 14, wherein the feedback network comprises:
a metal-oxide-semiconductor field-effect transistor (MOSFET) including a gate terminal that receives the output of the current comparator circuit, the MOSFET being configured to operate as a switch such that (i) when the output received at the gate terminal indicates that the first current is greater than the second current, the MOSFET is turned on and current flows between drain and source terminals of the MOSFET, and (ii) when the output received at the gate terminal indicates that the second current is greater than the first current, the MOSFET is turned off and no current flows between the drain and source terminals.

* * * * *